United States Patent
Jou et al.

(10) Patent No.: US 7,821,070 B2
(45) Date of Patent: Oct. 26, 2010

(54) TRIG MODULATION ELECTROSTATIC DISCHARGE (ESD) PROTECTION DEVICES

(75) Inventors: Yeh-Ning Jou, Taipei County (TW); Hwa-Chyi Chiou, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 100 days.

(21) Appl. No.: 12/265,603

(22) Filed: Nov. 5, 2008

(65) Prior Publication Data

US 2009/0261417 A1 Oct. 22, 2009

(30) Foreign Application Priority Data

Apr. 21, 2008 (TW) ............................. 97114475 A

(51) Int. Cl.
*H01L 23/60* (2006.01)
(52) U.S. Cl. ............................. 257/360; 257/E27.067
(58) Field of Classification Search ................. 257/360, 257/532, 533, 536, E27.062, E27.067
See application file for complete search history.

(56) References Cited

U.S. PATENT DOCUMENTS

| 6,452,235 | B1* | 9/2002 | Hsia ............................. 257/355 |
| 6,650,165 | B1* | 11/2003 | Mallikarjunaswamy ..... 327/310 |
| 2007/0091530 | A1* | 4/2007 | Chen ........................... 361/111 |
| 2008/0007882 | A1* | 1/2008 | Bernard et al. ................. 361/56 |

* cited by examiner

*Primary Examiner*—Sue Purvis
*Assistant Examiner*—W. Wendy Kuo

(57) ABSTRACT

Trig modulation electrostatic discharge (ESD) protection devices are presented. An ESD protection device includes a semiconductor substrate. A high voltage N-well (HVNW) region is formed in the semiconductor substrate. An NDD region, a first P-body region and a second P-body region are formed in the HVNW region, wherein the first P-body region is separated from the second P-body region with a predetermined distance, and wherein the NDD region is isolated from the first P-body region with an isolation region. An N$^+$ doped source region is disposed in the NDD region. An N$^+$ doped region is disposed in the first P-body region. A P$^+$ doped region is disposed in the second P-body region. A first gate is disposed between the N$^+$ doped region and the isolation region, and a second gate is disposed between the N$^+$ doped region and the P$^+$ doped region.

3 Claims, 9 Drawing Sheets

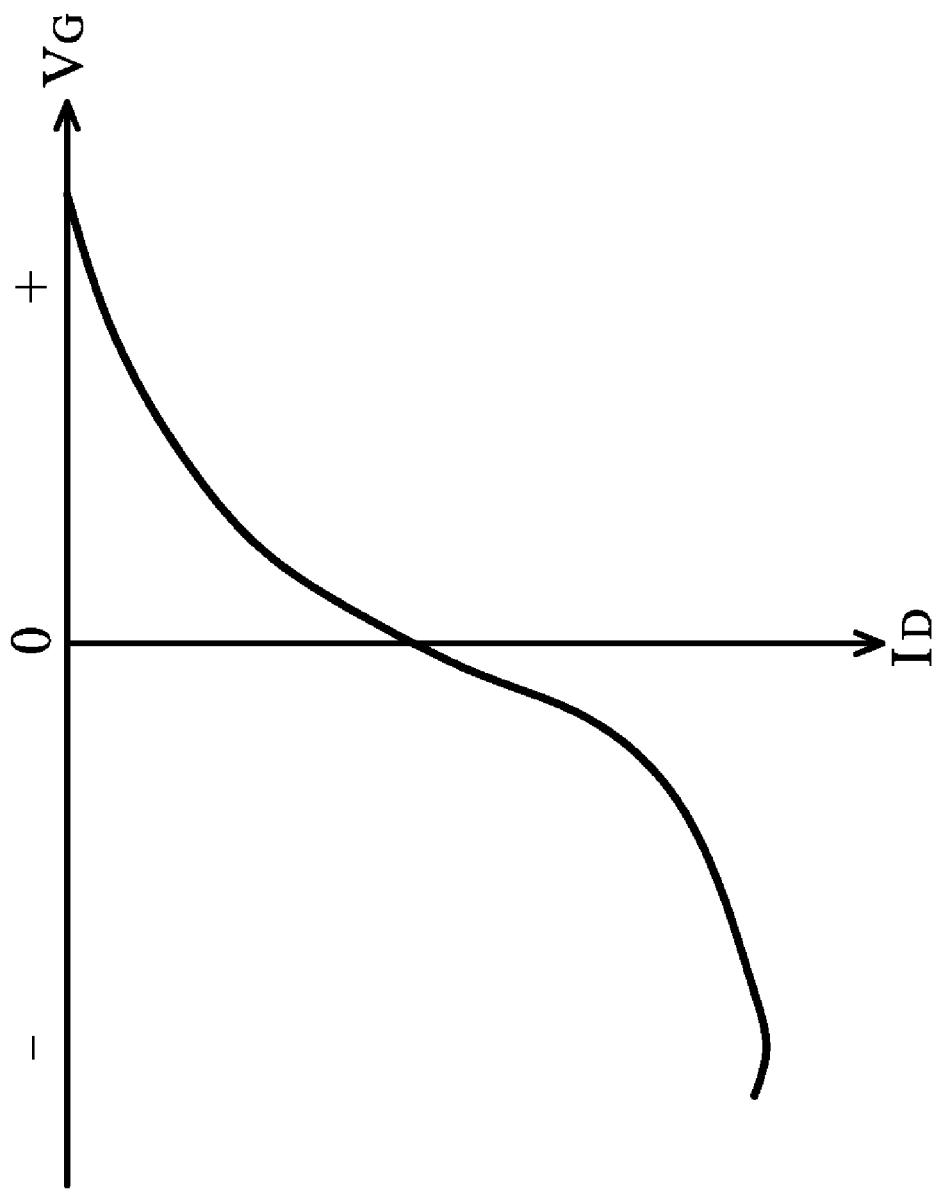

TRIG MODULATION ELECTROSTATIC DISCHARGE (ESD) PROTECTION DEVICES

CROSS REFERENCE TO RELATED APPLICATIONS

This application is based upon and claims the benefit of priority from a prior Taiwanese Patent Application No. 097114475, filed on Apr. 21, 2008, the entire contents of which are incorporated herein by reference.

BACKGROUND OF THE INVENTION

1. Field of the Invention

The invention relates to semiconductor devices, and in particular, to trig modulation electrostatic discharge (ESD) protection devices.

2. Description of the Related Art

Conventional high voltage electrostatic discharge (ESD) protection devices include lateral diffused metal oxide semiconductor (LDMOS) power transistors, metal oxide semiconductor field effect transistors (MOSFET), silicon control rectifiers (SCR), bipolar junction transistors (BJT), diodes and field oxide devices (FOD). For ESD protection during high voltages, an inner circuit may either be damaged or result in a latch-up effect due to an over-high trigger voltage and an over-low holding voltage. Therefore, by adding an additional driving circuit, or by regulating layout parameters, trig voltage can be reduced such that a holding voltage of a device can be higher than an operation voltage. Thus, resulting in a high voltage electrostatic discharge (ESD) protection device.

FIG. 1 is a schematic diagram illustrating the relationship between voltage and current of a conventional high voltage ESD protection device. Because the holding voltage $V_h$ of the conventional high voltage ESD protection device cannot reach higher than the operation voltage $V_{DD}$ of the circuit, it is therefore desirable to increase the holding voltage $V_h$ of the ESD protection device such that the holding voltage is maintained over the operation voltage $V_{DD}$, as shown by the dash line of FIG. 1. By increasing the holding voltage $V_h$, however, the trig voltage $V_{trig}$ of the ESD protection device is also increased. Thus, the dilemma of trying to hold the trig voltage $V_{trig}$ of the ESD protection device at a low level.

The conventional method for reducing the trig voltage of the ESD protection device is by augmenting the base-emitter resistance $R_{BE}$ of the parasitic BJT device, i.e., extending the distance between the source and the bulk. However, enlarging the distance between the source and the bulk does not result in a major effect, increases layout area of the device, and hinders device integration.

FIG. 2A is a cross section of a conventional ESD protection device. Referring to FIG. 2A, a conventional ESD protection device 10 includes a p-type semiconductor substrate 11. A high voltage n-type well region 12 is formed in the p-type semiconductor substrate 11. An n-type drain drifted region (NDD) 14 and a p-type body doped region 15 are disposed in the high voltage n-type well region 12, wherein the n-type drain drifted region (NDD) 14 and the p-type body doped region 15 are separated by an isolation 13a. An n-type drain doped region 16 is disposed in the n-type drain drifted region (NDD) 14. An n-type heavily doped region 17 and a p-type heavily doped region 18 are disposed in the p-type body doped region 15, wherein the n-type heavily doped region 17 and the p-type heavily doped region 18 are separated by an isolation 13b. A gate 19 is disposed between the n-type heavily doped region 17 and the isolation 13a. The ESD protection device 10 is isolated from other devices in the circuit by an isolation 13c. During operation, the n-type drain doped region 16 is coupled to the operation voltage $V_{DD}$ of the circuit. The gate 19, the n-type heavily doped region 17, and the p-type heavily doped region 18 are coupled to a voltage $V_{SS}$ or a ground. Therefore, the abovementioned ESD protection device 10 is also referred to as a gate ground NMOS (GGNMOS) transistor device.

FIG. 2B is a cross section of another conventional ESD protection device. In FIG. 2B, the conventional ESD protection device 20 includes a p-type semiconductor substrate 21. A high voltage n-type well region 22 is formed in the p-type semiconductor substrate 21. An n-type drain drifted region (NDD) 24 and a p-type body doped region 25 are disposed in the high voltage n-type well region 22, wherein the n-type drain drifted region (NDD) 24 and the p-type body doped region 25 are separated by an isolation 23a. An n-type drain doped region 26 is disposed in the n-type drain drifted region (NDD) 24. An n-type heavily doped region 27 and a p-type heavily doped region 28 are disposed in the p-type body doped region 25. A gate 29 is disposed between the n-type heavily doped region 27 and the isolation 23a. The ESD protection device 20 is isolated from other devices in the circuit by an isolation 23c. During operation, the n-type drain doped region 26 is coupled to the operation voltage $V_{DD}$ of the circuit and coupled to a first end of a capacitor. Both the n-type heavily doped region 27 and the p-type heavily doped region 28 are coupled to a voltage $V_{SS}$ or a ground. The gate 29 is coupled to a second end of the capacitor and coupled to a first end of a resistor. Therefore, the abovementioned ESD protection device 20 is also referred as a capacitive ESD protection device.

FIG. 3A is a cross section of another conventional ESD protection device, which increases the base-emitter resistance $R_{BE}$ of the parasitic BJT device and maintains advantages of the capacitive ESD protection devices. Referring to FIG. 3A, the conventional ESD protection device 50 includes a p-type semiconductor substrate 51. A high voltage n-type well region 52 is formed in the p-type semiconductor substrate 51. An n-type drain drifted region (NDD) 54 and a p-type body doped region 55 are disposed in the high voltage n-type well region 52, wherein the n-type drain drifted region (NDD) 54 and the p-type body doped region 55 are separated by an isolation 53a. An n-type drain doped region 56 is disposed in the n-type drain drifted region (NDD) 54. An n-type heavily doped region 57 and a p-type heavily doped region 58 are disposed in the p-type body doped region 55, wherein the n-type heavily doped region 57 and the p-type heavily doped region 58 are separated by an isolation 53b. A gate 59 is disposed between the n-type heavily doped region 57 and the isolation 53a. The ESD protection device 50 is isolated from other devices in the circuit by an isolation 53c. During operation, the n-type drain doped region 56 is coupled to the operation voltage $V_{DD}$ of the circuit and coupled to a first end of a capacitor. Both the n-type heavily doped region 57 and the p-type heavily doped region 58 are coupled to a voltage $V_{SS}$ or a ground. The gate 59 is coupled to a second end of the capacitor and coupled to a first end of a resistor. The equivalent circuit diagram of the ESD protection device 50 is shown in FIG. 3B. However, the enlarged distance between the source and the bulk only slightly increases the base-emitter resistance $R_{BE}$ of the parasitic BJT device 65, and does not effectively reduce the trig voltage thereof. Moreover, the layout area of the device is undesirably increased, which is detrimental to scaling down of the device layout as well as integration with other devices.

BRIEF SUMMARY OF THE INVENTION

Accordingly, in order to overcome problems mentioned previously and to achieve device miniaturization, embodiments of the invention provide a trig modulation ESD protection device which separates the source of the NMOS transistor from the bulk and create a parasitic PMOS transistor to modulate the base-emitter resistance $R_{BE}$ of the parasitic BJT device.

An embodiment of the invention provides a trig modulation electrostatic discharge (ESD) protection device, comprising: a semiconductor substrate; a first transistor having a first drain electrically coupled to a first voltage, a first source electrically coupled to a second voltage, a first gate electrically coupled to a first end of a capacitor and a second of a resistor; and a second transistor having a second drain electrically coupled to a body of the first transistor, a second source electrically coupled to the second voltage and a first end of the resistor, and a second gate electrically coupled to the first gate of the first transistor, wherein a body of the second transistor is electrically coupled to the first voltage and a second end of the capacitor.

Another embodiment of the invention provides a trig modulation electrostatic discharge (ESD) protection device, comprising: a p-type semiconductor substrate; a high voltage n-type well region in the p-type semiconductor substrate; an n-type drain drifted region, a first p-type body doped region and a second p-type body doped region disposed in the high voltage n-type well region, wherein the first p-type body doped region and the second p-type body doped region are separated with a predetermined distance, and wherein the n-type drain drifted region and the first p-type body doped region are separated with an isolation; an n-type drain doped region disposed in the n-type drain drifted region; an n-type heavily doped region disposed in the first p-type body doped region; a p-type heavily doped region disposed in the second p-type body doped region; a first gate disposed between the n-type heavily doped region and the isolation; and a second gate disposed between the n-type heavily doped region and the p-type heavily doped region.

BRIEF DESCRIPTION OF THE DRAWINGS

The invention can be more fully understood by reading the subsequent detailed description and examples with references made to the accompanying drawings, wherein:

FIG. 5B is a schematic diagram illustrating the voltage-current relationship of a depleted PMOS transistor device of an embodiment of the invention.

DETAILED DESCRIPTION OF THE INVENTION

Figure 1:
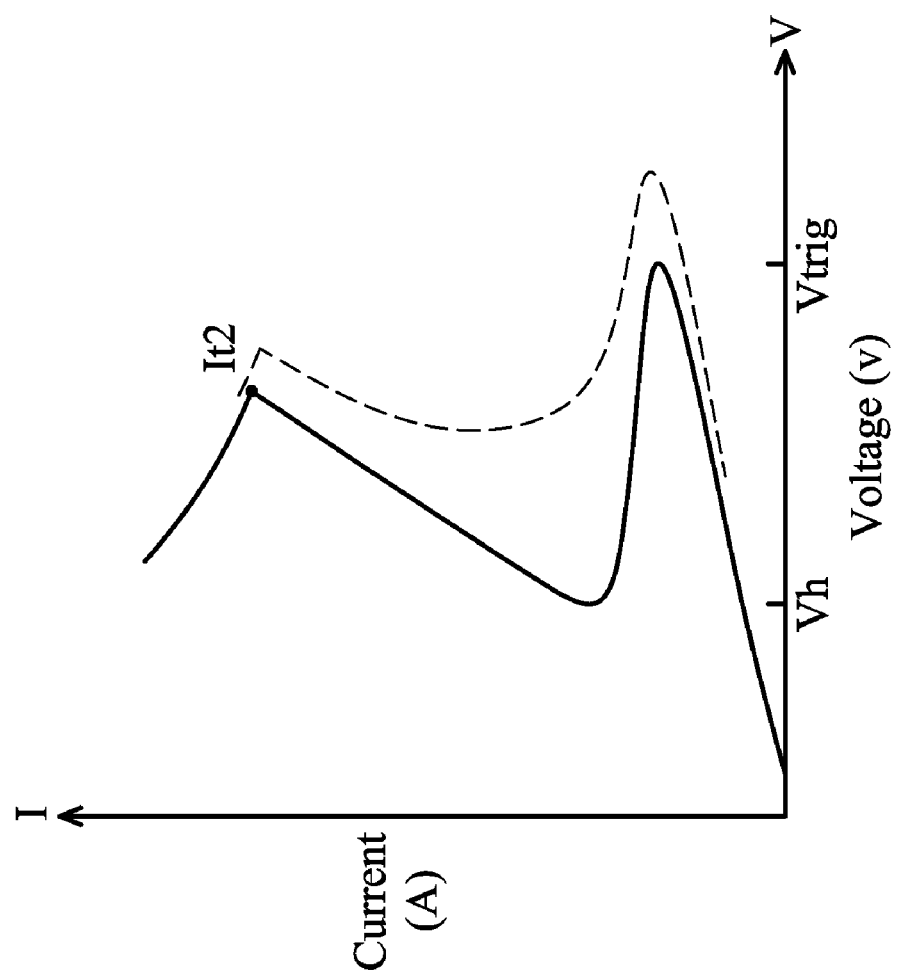
FIG. 1 is a schematic diagram illustrating the relationship between voltage and current of a conventional high voltage ESD protection device.
Figure 2A:
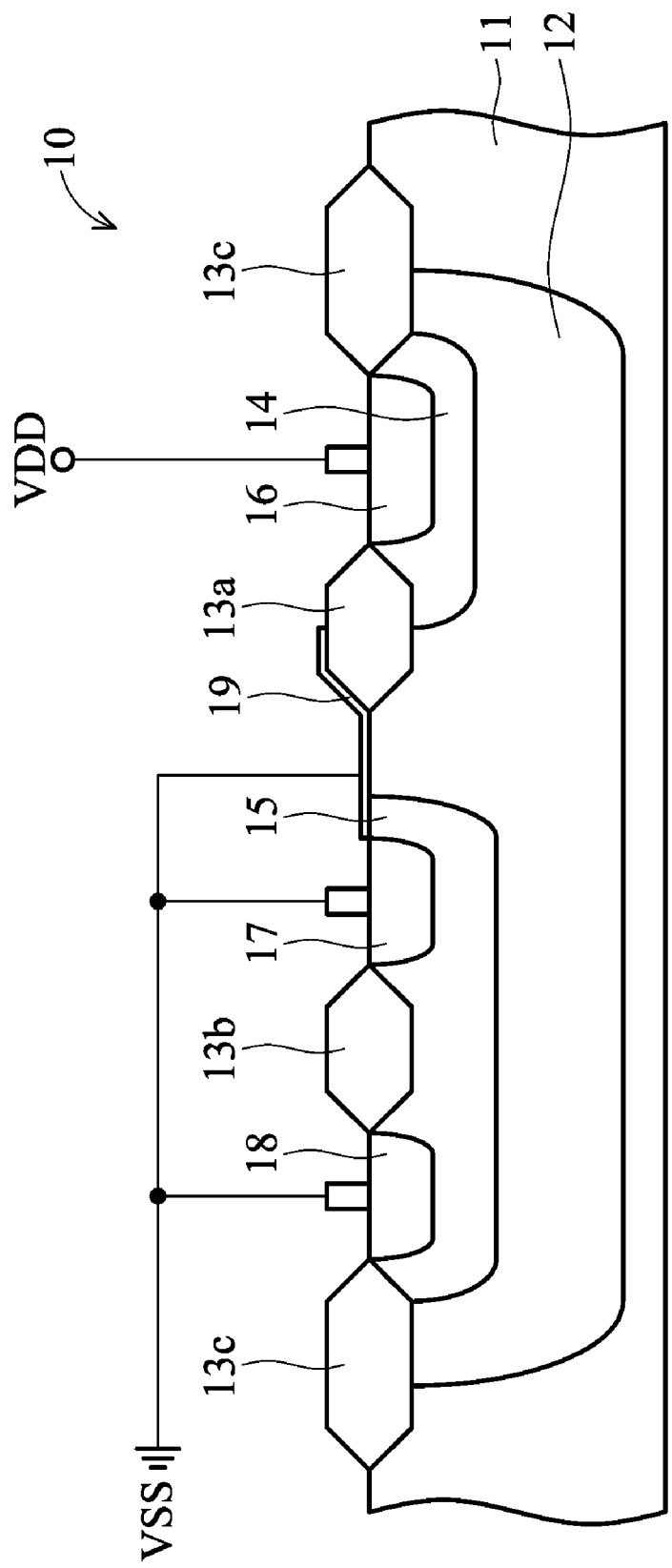
FIG. 2A is a cross section of a conventional ESD protection device.
Figure 2B:
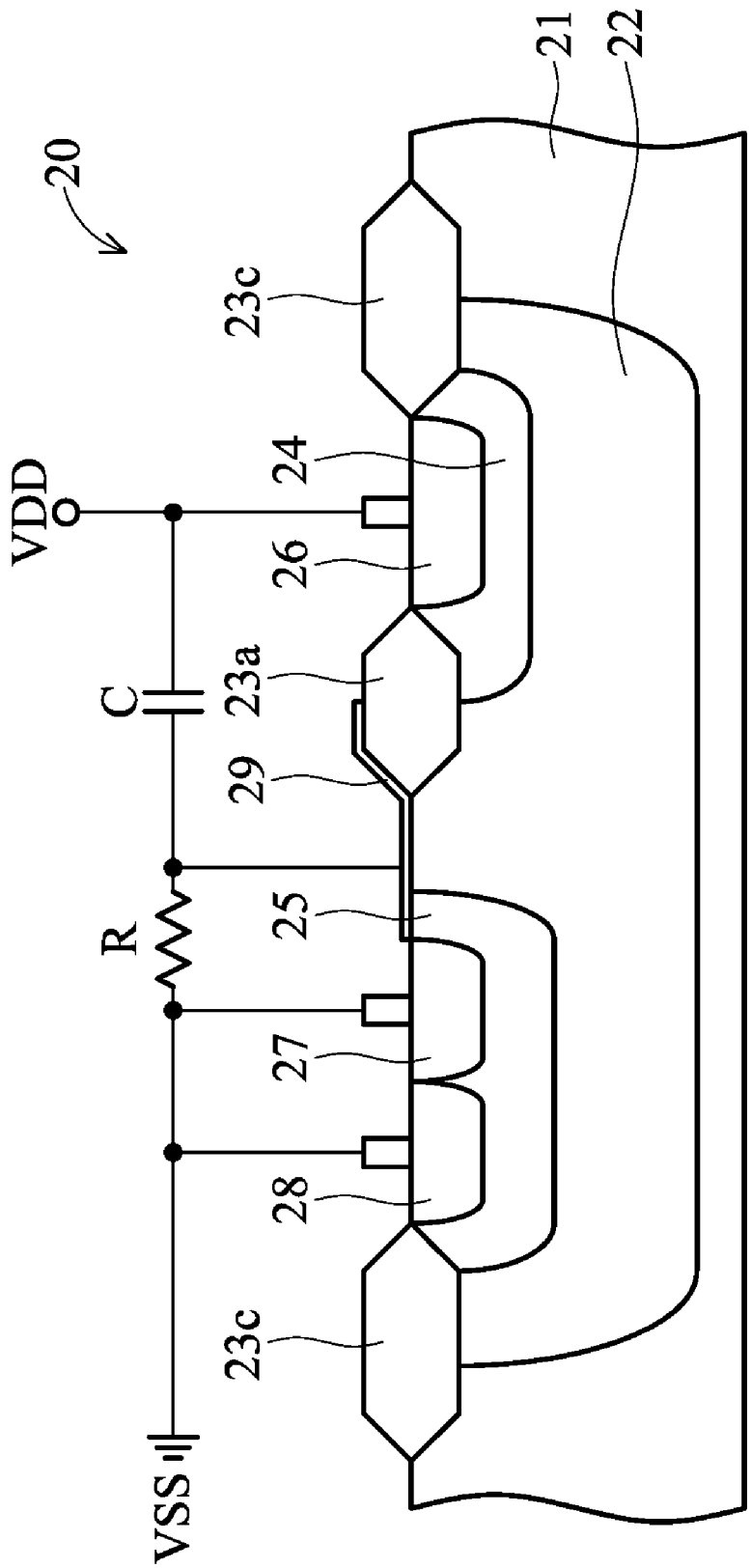
FIG. 2B is a cross section of another conventional ESD protection device.
Figure 3A:
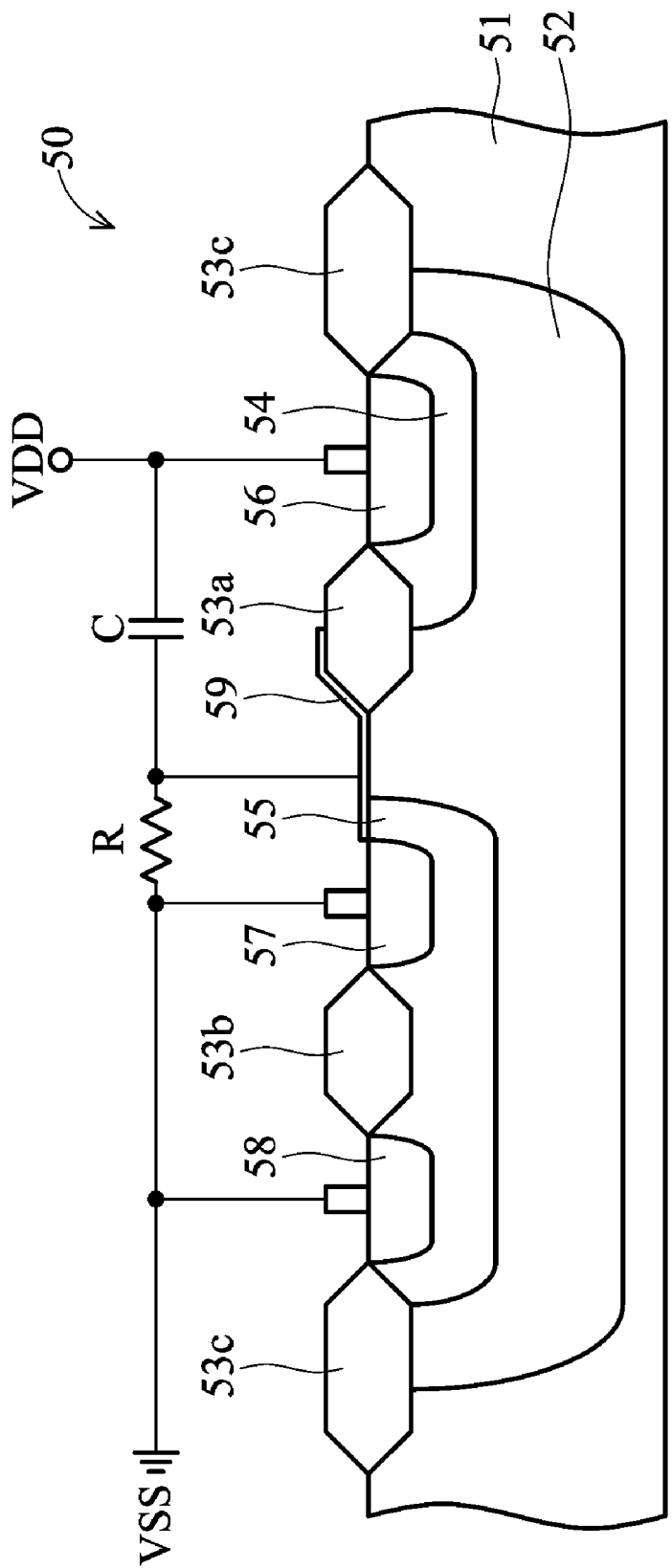
FIG. 3A is a cross section of another conventional ESD protection device, which increases the base-emitter resistance $R_{BE}$ of the parasitic BJT device and maintains advantages of the capacitive ESD protection devices.
Figure 3B:
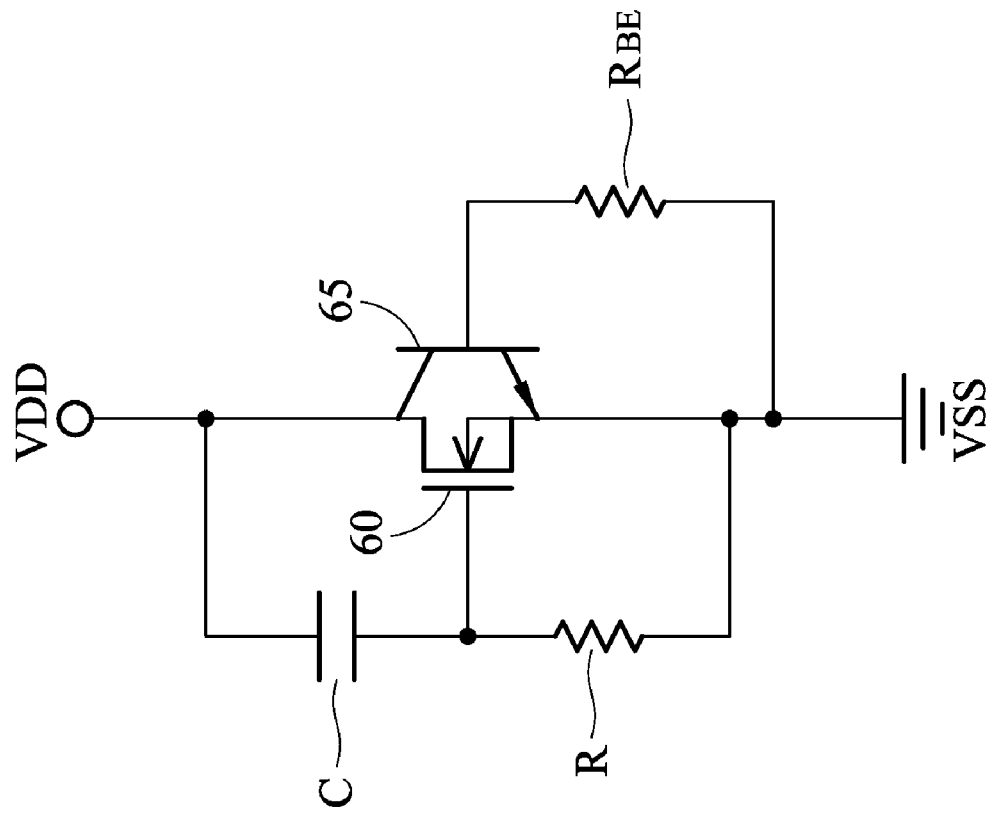
FIG. 3B shown an equivalent circuit diagram of the ESD protection device of FIG. 3A.

It is to be understood that the following disclosure provides many different embodiments, or examples, for implementing different features of various embodiments. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself indicate a relationship between the various embodiments and/or configurations discussed. Moreover, the formation of a first feature over or on a second feature in the description that follows may include embodiments in which the first and second features are formed in direct contact or not in direct contact.

Figure 4:
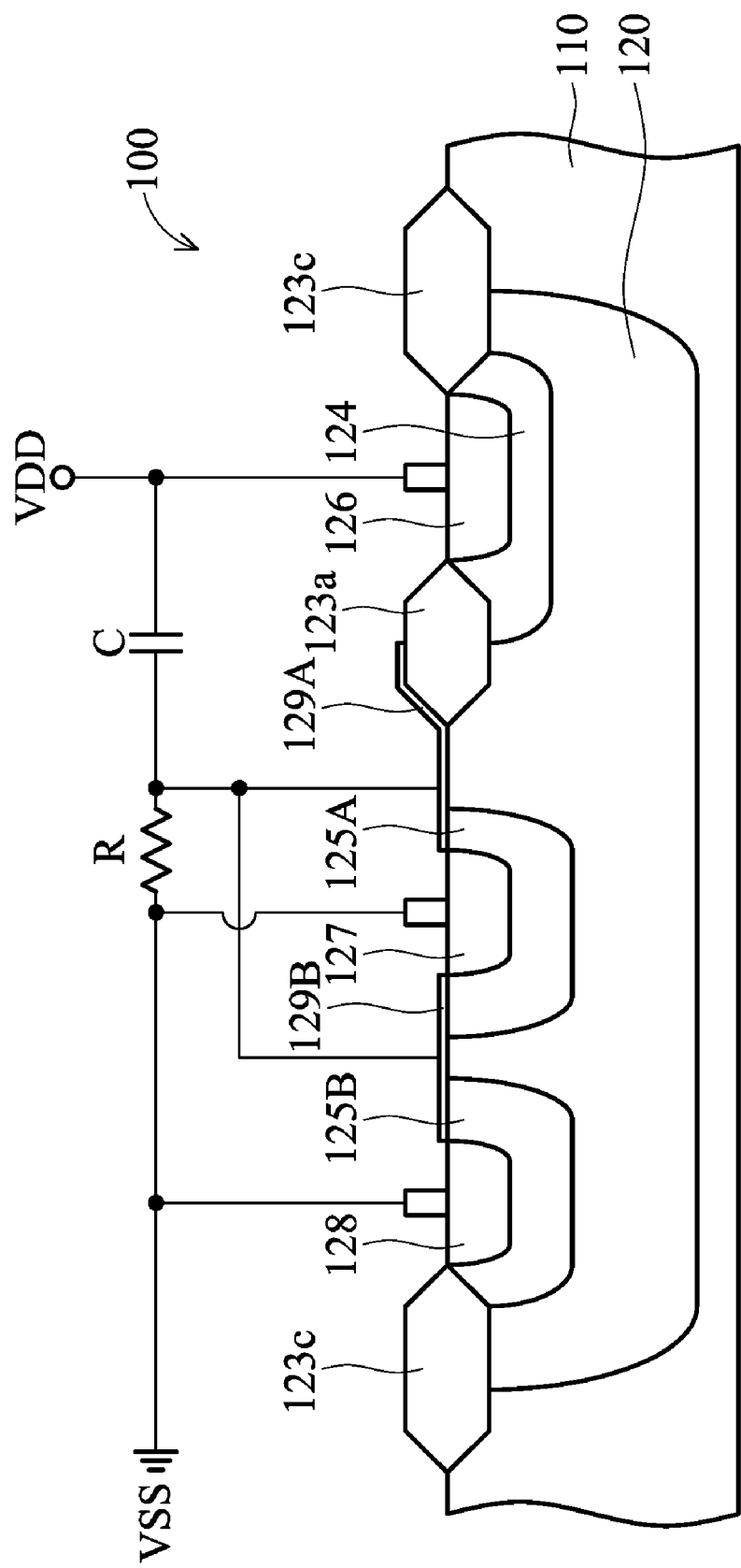
FIG. 4 is a cross section of an embodiment of the trig modulation ESD protection device of the invention.

FIG. 4 is a cross section of an embodiment of the trig modulation ESD protection device of the invention. In FIG. 4, the trig modulation ESD protection device 100 includes a p-type semiconductor substrate 110. A high voltage n-type well (HVNW) region 120 is formed in the p-type semiconductor substrate 110. An n-type drain drifted region (NDD) 124, a first p-type body doped region 125A and a second p-type body doped region 125B are disposed in the high voltage n-type well region 120, wherein the first p-type body doped region 125A and the second p-type body doped region 125B are separated by a predetermined distance, and the n-type drain drifted region (NDD) 124 and the first p-type body doped region 125A are separated by an isolation 123a. An n-type drain doped region 126 is disposed in the n-type drain drifted region (NDD) 124. An n-type heavily doped region 127 is disposed in the first p-type body doped region 125A and a p-type heavily doped region 128 is disposed in the second p-type body doped region 125B. A first gate 129A is disposed between the n-type heavily doped region 127 and the isolation 123a, and a second gate 129B is disposed between the n-type heavily doped region 127 and the p-type heavily doped region 128. The ESD protection device 100 is isolated from other devices in the circuit by an isolation 123c. During operation, the n-type drain doped region 126 is coupled to the operation voltage $V_{DD}$ of the circuit and coupled to a first end of a capacitor. Both the n-type heavily doped region 127 and the p-type heavily doped region 128 are coupled to a voltage $V_{SS}$ or a ground. The gates 129A and 129B are coupled to a second end of the capacitor and coupled to a first end of a resistor.

Figure 5A:
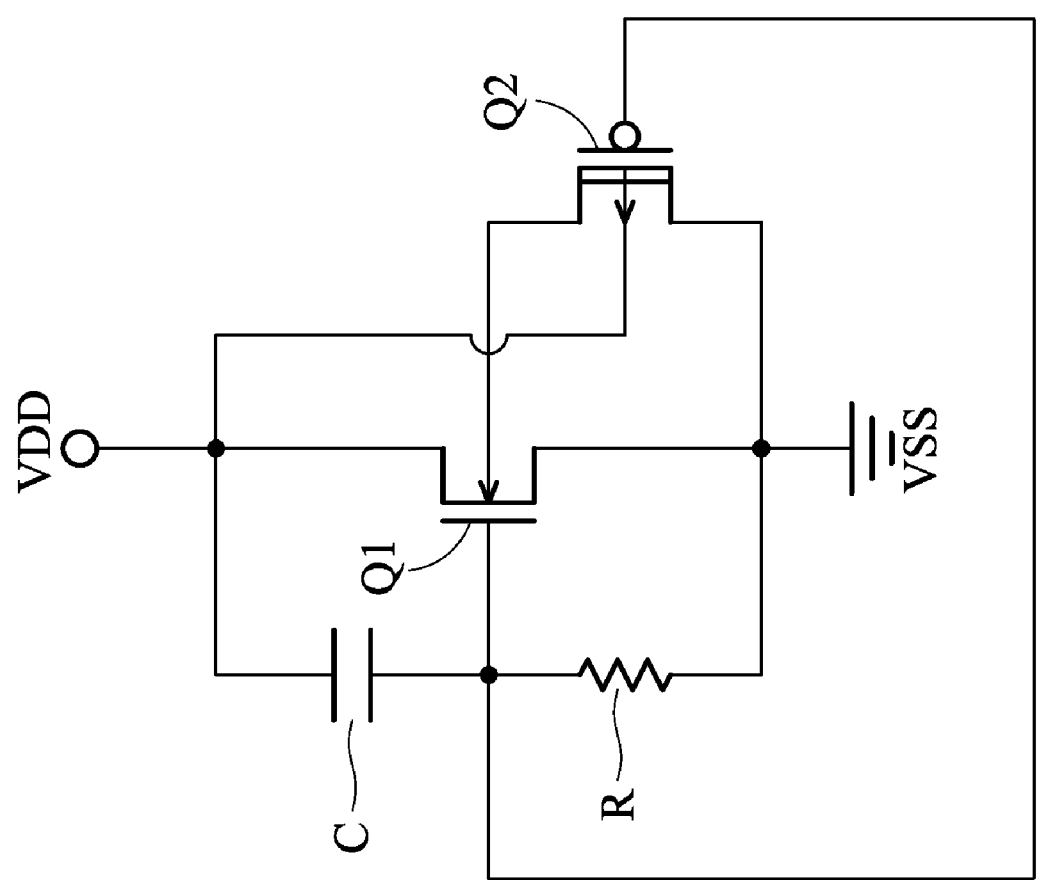
FIG. 5A is an embodiment of the equivalent circuit diagram of the ESD protection device of FIG. 4.

FIG. 5A is an embodiment of the equivalent circuit diagram of the ESD protection device of FIG. 4. In FIG. 5A, a trig modulation ESD protection device includes a first transistor Q1 having a first drain electrically coupled to a first voltage (e.g., operatic voltage) $V_{DD}$, a second source electrically coupled to a second voltage (e.g., grounded voltage) $V_{SS}$, and a first gate electrically coupled to a first end of a capacitor C and coupling to a second end of a resistor R. A second transistor Q2 has a second drain electrically coupled to the body of the first transistor, a second source electrically coupled to the second voltage (e.g., grounded voltage) $V_{SS}$ and a first end of the resistor R, and a second gate electrically coupled to the first gate of the first transistor Q1, wherein the body of the second transistor Q2 is electrically coupled to the first voltage (e.g., operatic voltage) $V_{DD}$ and coupled to the second of the capacitor C.

Note that the first transistor comprises an NMOS transistor device and the second transistor comprises a depleted PMOS transistor device. FIG. 5B is a schematic diagram illustrating the voltage-current relationship of a depleted PMOS transistor device of an embodiment of the invention. When the gate voltage $V_G$ equals zero, the depleted PMOS transistor device is maintained at a drain current $I_D$, i.e., the transistor device is at an on-state. On the other hand, when the gate voltage $V_G$ is gradually increased, the drain current $I_D$ of the depleted PMOS transistor device is gradually decreased until the transistor device is finally at an off-state.

Figure 6:
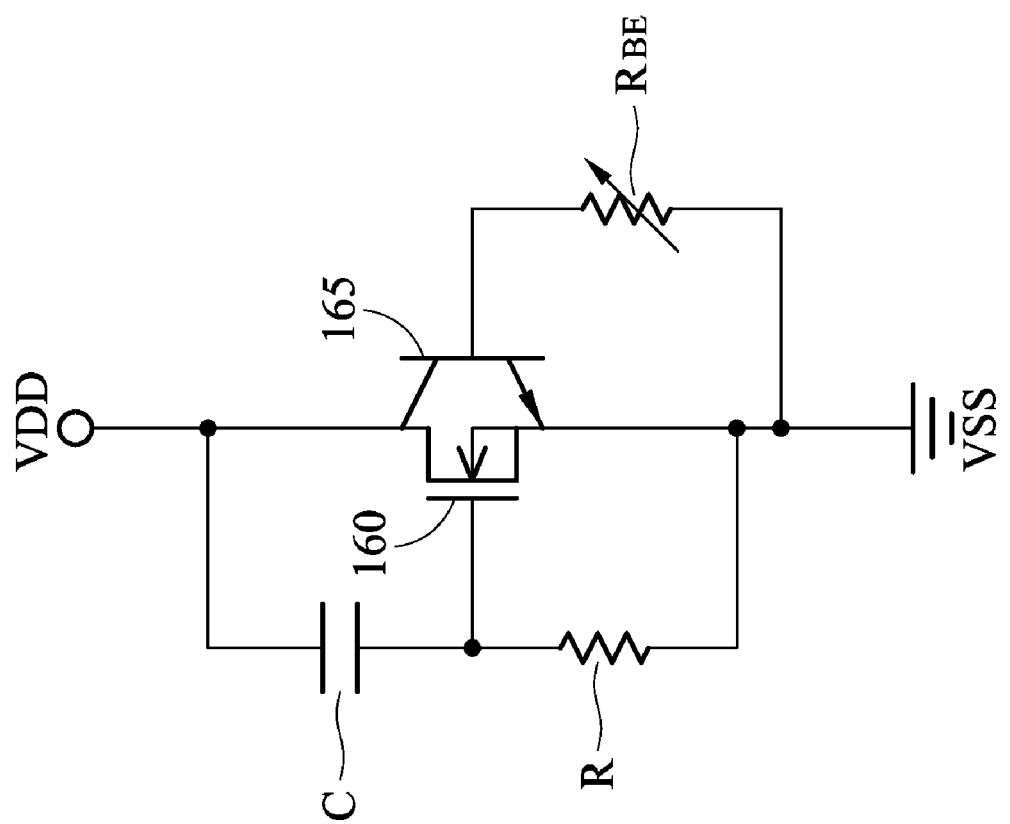
FIG. 6 shows an equivalent circuit diagram of an embodiment of the base-emitter resistance $R_{BE}$ of the parasitic BJT device and the NMOS transistor of the ESD protection device of the invention.

According to embodiments of the invention, the n-type drain doped region, the n-type heavily doped region, and the first gate are composed of an NMOS transistor device 160. The n-type heavily doped region, the p-type heavily doped region and the second gate are composed of a depleted PMOS transistor device, such as a parasitic BJT device 165. The base-emitter resistance $R_{BE}$ of the parasitic BJT device 165 can be modulated, as shown in FIG. 6. Note that by modulating the base-emitter resistance $R_{BE}$, the trig voltage ($V_{trig}$) of the ESD protection device is effectively controlled and enhanced. Under the ESD zapping status, the floating p-type body doped region on the source end can induce extremely large substrate current $I_{sub}$ to turn on the abovementioned trig modulation ESD protection device.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A trig modulation electrostatic discharge (ESD) protection device, comprising:
   a semiconductor substrate;
   a first transistor having a first drain electrically coupled to a first voltage, a first source electrically coupled to a second voltage, a first gate electrically coupled to a first end of a capacitor and a second of a resistor; and
   a second transistor having a second drain electrically coupled to a body of the first transistor, a second source electrically coupled to the second voltage and a first end of the resistor, and a second gate electrically coupled to the first gate of the first transistor, wherein a body of the second transistor is electrically coupled to the first voltage and a second end of the capacitor,
   wherein the second transistor includes a depleted PMOS transistor.

2. The trig modulation electrostatic discharge (ESD) protection device as claimed in claim 1, wherein the first voltage is a driving voltage, and the second voltage is grounded.

3. The trig modulation electrostatic discharge (ESD) protection device as claimed in claim 1, wherein the first transistor includes an NMOS transistor.

* * * * *